United States Patent [19]
Nobel et al.

[11] Patent Number: 5,533,904
[45] Date of Patent: Jul. 9, 1996

[54] ELECTRICAL INTERCONNECT SYSTEM FOR MULTIPLE FLEXIBLE CIRCUITS

[75] Inventors: Gary M. Nobel; Arthur K. Wilson, both of San Diego; Patricia S. Brown, Encinitas; Jason R. Arbeiter, Poway, all of Calif.

[73] Assignee: Hewlett-Packard Company, Palo Alto, Calif.

[21] Appl. No.: 234,810

[22] Filed: Apr. 28, 1994

Related U.S. Application Data

[63] Continuation-in-part of Ser. No. 56,692, Apr. 30, 1993, Pat. No. 5,372,512.

[51] Int. Cl.[6] ............................................. H01R 9/09
[52] U.S. Cl. .................................. 439/67; 439/493
[58] Field of Search ...................... 439/66, 67, 77, 439/85, 493, 401, 374, 377, 378; 346/76 PH, 76 R; 361/736, 748, 749

[56] References Cited

U.S. PATENT DOCUMENTS

| | | | |
|---|---|---|---|
| 4,403,272 | 9/1983 | Larson et al. | 439/85 X |
| 4,408,836 | 10/1983 | Kikuno | 439/85 X |
| 4,913,656 | 4/1990 | Gordon et al. | 439/67 |
| 5,158,466 | 10/1992 | Schreiber et al. | 439/67 |
| 5,205,740 | 4/1993 | Frankeny et al. | 439/67 |
| 5,205,750 | 4/1993 | Darrow et al. | 439/67 X |
| 5,213,511 | 5/1993 | Sobhani | 439/67 |
| 5,273,440 | 12/1993 | Ashman et al. | 439/67 X |
| 5,295,838 | 3/1994 | Walen et al. | 439/67 |

Primary Examiner—Khiem Nguyen

[57] ABSTRACT

An improved interconnect system for an inkjet printer. The inventive interconnect system includes first and second unitary flexible circuits having first and second sets of contacts, respectively, for providing first and second electrical interconnections, respectively. The first and second flexible circuits are aligned and retained so that contacts thereon engage corresponding contacts disposed on a rigid support. In a specific implementation, the first flexible circuit is aligned by a first set of pins arranged along a first axis and the flexible circuit is aligned by a second set of pins arranged along a second axis, perpendicular to the first axis. This arrangement allows for the alignment and mounting of two flexible circuits on a single printer carriage without a substantial increase in the width thereof. The first flexible circuit may be used to connect the inkjet pens to the electronic drive circuit and the second flexible circuit may be used to connect a paper sensor or other device to the electronic circuit.

19 Claims, 13 Drawing Sheets

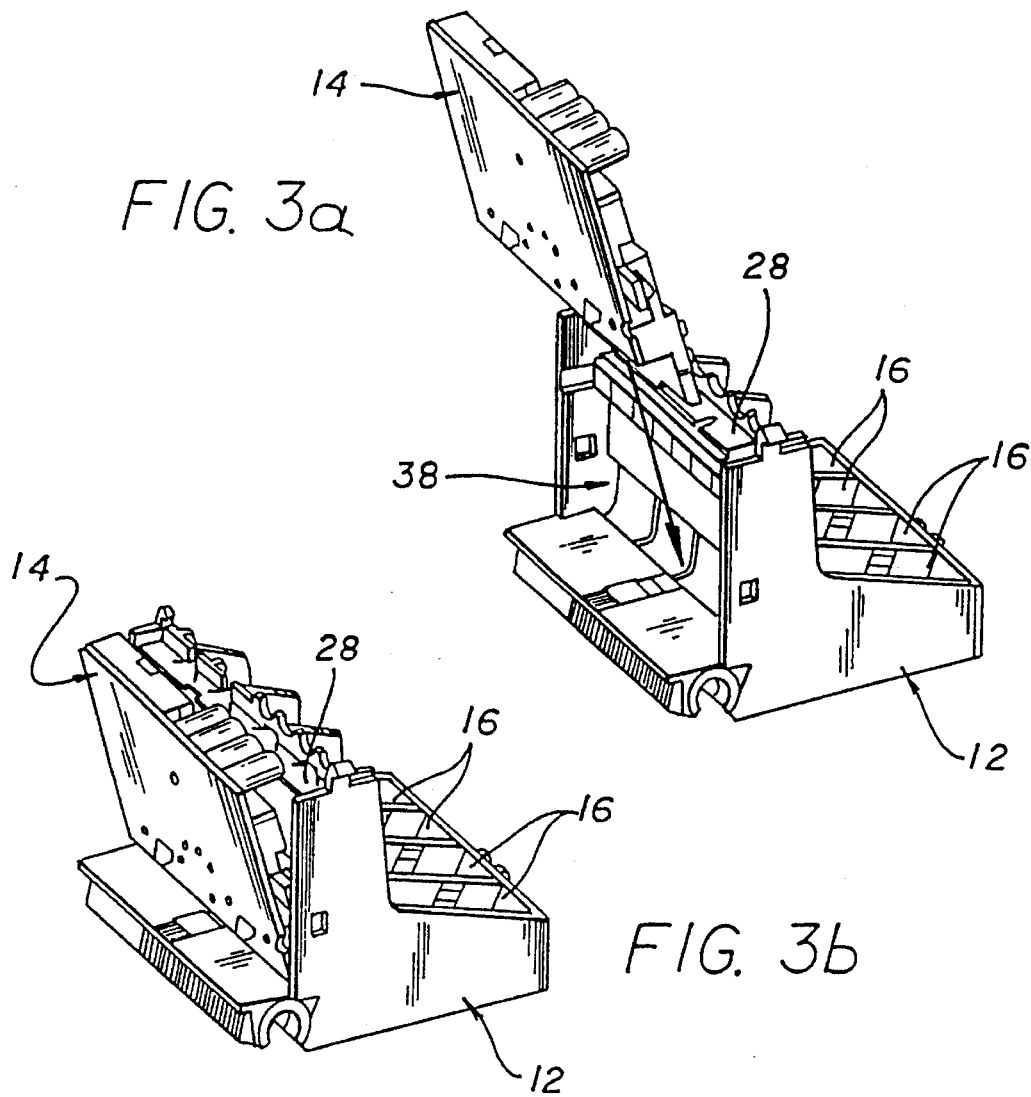
FIG. 3a
FIG. 3b
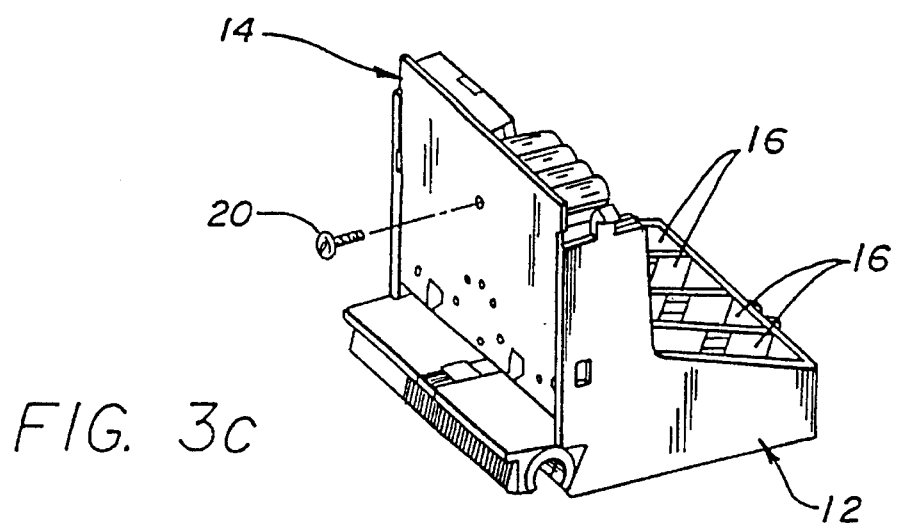
FIG. 3c

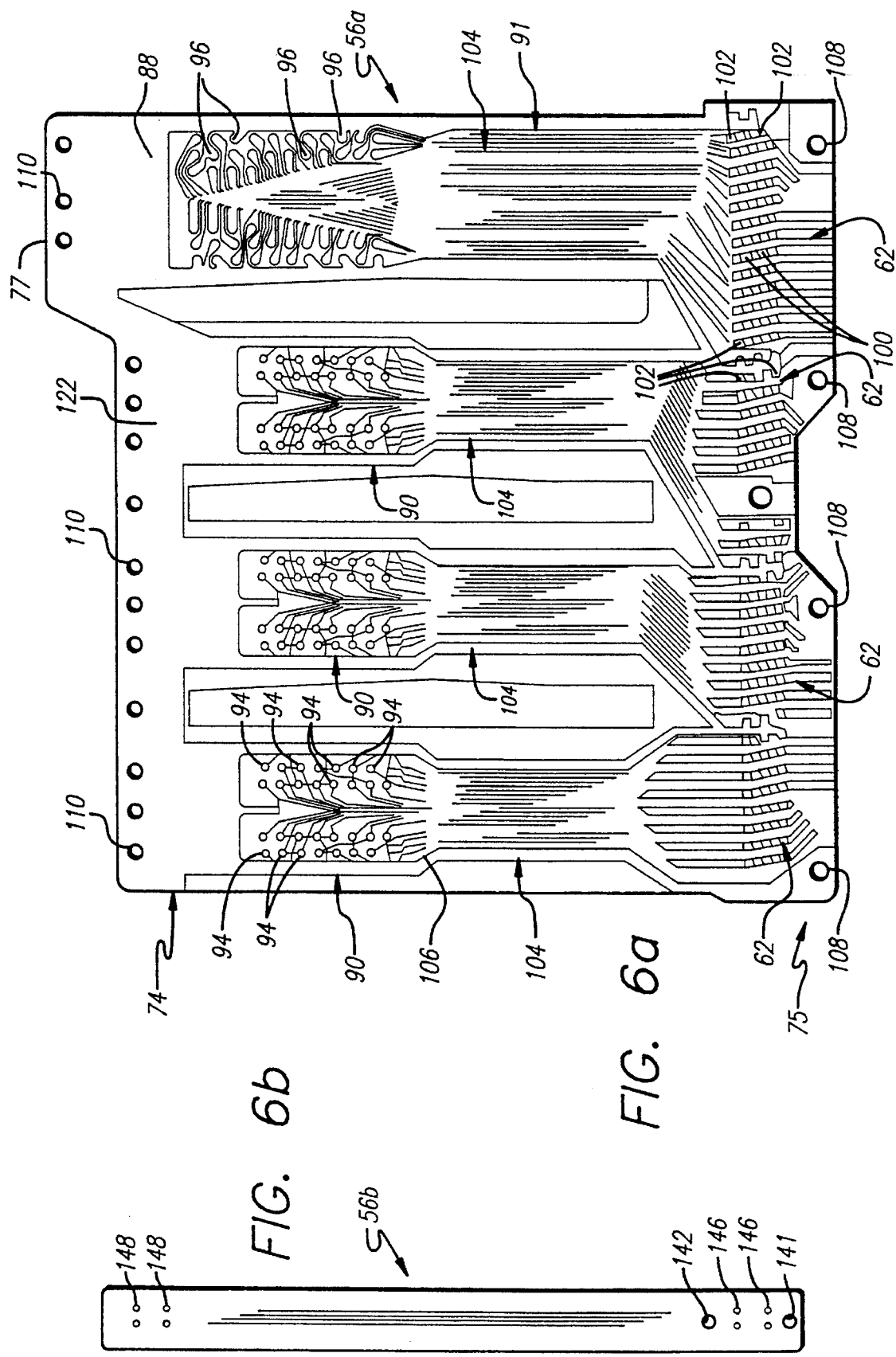

ELECTRICAL INTERCONNECT SYSTEM FOR MULTIPLE FLEXIBLE CIRCUITS

This is a continuation-in-part of U.S. patent application No. 08/056,692, entitled Electrical Interconnect System for Multiple Flexible Circuits, filed Apr. 30, 1993 by A. K. Wilson et al (Atty Docket #HP 1093131) issued Dec. 13, 1994 as U.S. Pat. No. 5,372,512.

BACKGROUND OF THE INVENTION

1. Field of the Invention

This invention relates to electrical interconnect apparatus. More particularly, the present invention relates apparatus for connecting a thermal inkjet pen and associated sensor to a printed circuit board.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Inkjet printer/plotters and desktop printers, such as those sold by Hewlett Packard Company, offer substantial improvements in speed over the conventional X-Y plotter. Inkjet printer/plotters typically include a pen having an array of nozzles. The pens are mounted on a carriage which is moved across the page in successive swaths. Each inkjet pen has heater circuits which, when activated, cause ink to be ejected from associated nozzles. As the pen is positioned over a given location, a jet of ink is ejected from the nozzle to create a pixel at a selected location. The mosaic of pixels thus created provides a composite image.

Inkjet technology is now well known in the art. See, for example, U.S. Pat. No. 4,872,027, entitled PRINTER HAVING IDENTIFIABLE INTERCHANGEABLE HEADS, issued Oct. 3, 1989, to W. A. Buskirk et al. and U.S. Pat. No. 4,965,593, entitled PRINT QUALITY OF DOT PRINTERS, issued Oct. 23, 1990, to M. S. Hickman, the teachings of which are incorporated herein by reference.

Recently, full color inkjet printer/plotters and desktop printers have been developed which comprise a plurality of inkjet pens of diverse colors. A typical color inkjet printer/plotter has four inkjet pens, one that stores black ink, and three that store colored inks, e.g., magenta, cyan and yellow. The colors from the three color pens are mixed to obtain various colors.

The pens are typically mounted in stalls within an assembly which is mounted on the carriage of the printer/plotter. The carriage assembly positions the inkjet pens and typically holds the circuitry required for interfacing to the heater driver circuits in the inkjet pens.

A carriage assembly typically includes four pen stalls to align the inkjet pens, four pen clamps to hold the inkjet pens in the pen stalls, a printed circuit board with circuitry for interfacing the heater circuits in the inkjet pens, and four separate flexible (flex) circuits interconnecting the printed circuit board with electrical contacts on the inkjet pens. The flex circuit is typically made with a polyester or polyamide material such as a Mylar or Kapton substrate onto which multiple conductors or traces are created. The use of four separate flex circuits has the disadvantages of: 1) high cost due to the need to manufacture and stock the multiple separate flex circuits; 2) difficulty of assembly because of the need to route the flex circuit in the carriage assembly and precisely align each of the flex circuits to each of the pen housings; 3) high cost of assembly because the separate flex circuits need to be separately interconnected with the printed circuit board; and 4) the need to provide separate grounds for each flex circuit.

Accordingly, there was a need in the art for an improved interconnect system that reduced cost, was easy to assemble and align, and provided ground plane sharing for all of the inkjet pens. This need was addressed by U.S. patent application entitled UNITARY INTERCONNECT SYSTEM FOR AN INKJET PRINTER, filed Apr. 30, 1993 by A. K. Wilson et al., Ser. No. 08/055,615 (Attorney Docket No. HP 1093126), the teachings of which are incorporated herein by reference. This application discloses and claims an advantageous flexible circuit for use with inkjet printers.

Unfortunately, this system provides for the interconnection of a single flex circuit to the printed circuit board. For some applications, there is a need to connect multiple flex circuits to a printed circuit board.

There are a number of conventional approaches to the interconnection of multiple flexible circuits to a printed circuit board. One conventional approach is to simply solder the additional flex circuit to the printed circuit board (PCB). This approach, however, has the disadvantages of: 1) low interconnect density, because it is necessary to maintain the spacing between interconnects to prevent solder bridging, and 2) the need to use Kapton, which is more tolerant to heat than Mylar. Parts are costly and fabrication is difficult and costly as well.

A second conventional approach is to solder a connector to the additional flexible circuit for connection with a connector soldered onto the PCB. This approach offers ease of assembly and disassembly, but requires a connector on both the printed circuit board and the flexible circuit. In addition it requires a stiffener to be attached to the flexible circuit to support the connector, which increases the cost. It also has the disadvantage of achieving only low interconnect density.

A third conventional approach uses high pressure to force the flat contacts of the additional flex circuits onto the contacts of a printed circuit board. This approach has the disadvantage that a rigid structure is required to support the high pressure. In addition, this approach is limited in that it requires the contacts on the PCB to be above the surface of the PCB. Often a coating such as a solder mask is applied over a PCB to protect the conductors from solder bridging and moisture, which leaves the exposed contacts on the PCB slightly recessed below the surface of the PCB, which makes connection with the contacts difficult. The high pressure approach also has the disadvantage of high cost.

A fourth conventional approach is to use spring fingers which are soldered onto the PCB. The flexible circuit is then pressed onto the spring fingers to make contact. This approach has the shortcomings of high cost and low interconnect density, because of the space requirements for soldering the spring fingers to the PCB.

Another technique that has been used is a called a zebra stripe and consists of a elastomer having alternating conductive and nonconductive elastomer sections. The zebra stripe is placed between a flexible circuit and a PCB and then the entire assembly is pressed together to complete the interconnect. This approach has the shortcomings of low interconnect density, high cost, and low reliability.

Accordingly, there is a need in the art for an improved interconnect system that provides for low cost, high density, high reliability connection of multiple flex circuits to a printed circuit board.

SUMMARY OF THE INVENTION

The need in the art is addressed by the improved interconnect system for an inkjet printer of the present invention. The inventive interconnect system includes first and second unitary flexible circuits having first and second sets of contacts, respectively, for providing first and second electrical interconnections, respectively. The first and second flexible circuits are aligned and retained so that contacts thereon engage corresponding contacts disposed on a rigid support. In a specific implementation, the first flexible circuit is aligned by a first set of pins arranged along a first axis and the second flexible circuit is aligned by a second set of pins arranged along a second axis, perpendicular to said first axis. This arrangement allows for the alignment and mounting of two flexible circuits on a single printer carriage without a substantial increase in the number of parts nor in the width thereof. The first flexible circuit may be used to connect the inkjet pens to the electronic drive circuit and the second flexible circuit may be used to connect a paper sensor or other device to the electronic circuit.

BRIEF DESCRIPTION OF THE DRAWINGS

FIGS. 3a–3c are sequential perspective views of the carriage assembly which illustrate how the removable frame circuit assembly of the present invention is installed into the rear compartment in the unitary housing thereof.

FIG. 3a is a perspective view of the removable frame circuit assembly and the unitary housing immediately prior to installation. FIG. 3b is a perspective view of the removable frame circuit assembly in an intermediate position during installation into the rear compartment in the unitary housing. FIG. 3c is a perspective view of the removable frame circuit assembly installed into the rear compartment in the unitary housing.

FIG. 6a is a top plan view of the illustrative first flexible circuit constructed in accordance with the teachings of the present invention.

FIG. 6b is a top plan view of the illustrative second flexible circuit constructed in accordance with the teachings of the present invention.

DESCRIPTION OF THE INVENTION

Illustrative embodiments and exemplary applications will now be described with reference to the accompanying drawings to disclose the advantageous teachings of the present invention.

Figure 1A:
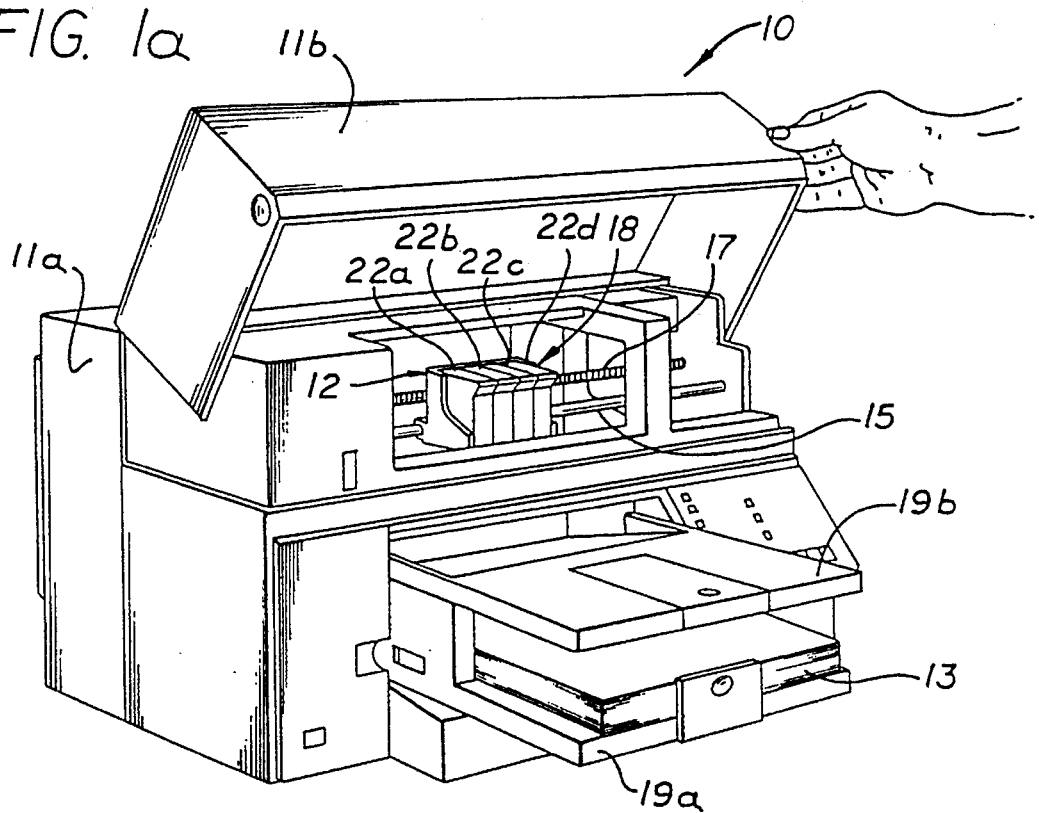
FIG. 1a is a perspective view of a thermal inkjet desktop printer incorporating the teachings of the present invention.

FIG. 1a is a perspective view of a thermal inkjet desktop printer incorporating the teachings of the present invention. The printer 10 includes a housing 11a and a protective front access lid 11b. A carriage assembly 18, is adapted for reciprocal motion along a carriage bar 15. The carriage assembly 18 includes a unitary housing 12 which retains three identical inkjet pens 22a, b and c and a dissimilar pen 22d. Each pen includes heater circuits which, when activated, cause ink to be ejected therefrom. One of the pens stores black ink and the remaining three pens store colored inks, e.g., magenta, cyan and yellow. When the pens are activated, the colors from the three color pens are mixed to obtain a desired color. The position of the carriage assembly 18 in the carriage scan axis along carriage bar 15 is determined by a carriage positioning mechanism (not shown). The carriage positioning mechanism is mounted on the carriage assembly 18 and senses its position relative to carriage encoder strip 17. An input tray 19a holds an media input stack 13 and after printing the printed media is held by an output tray 19b.

Figure 1B:
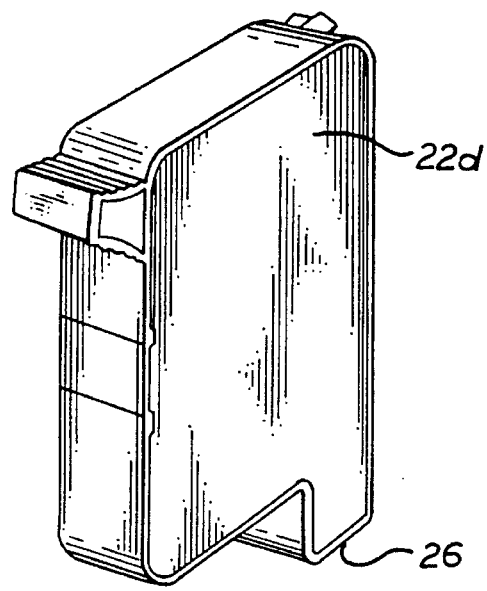
FIG. 1b is a rear perspective view of an inkjet pen.

FIG. 1b is a rear perspective view of an inkjet pen 22d.

Figure 1C:
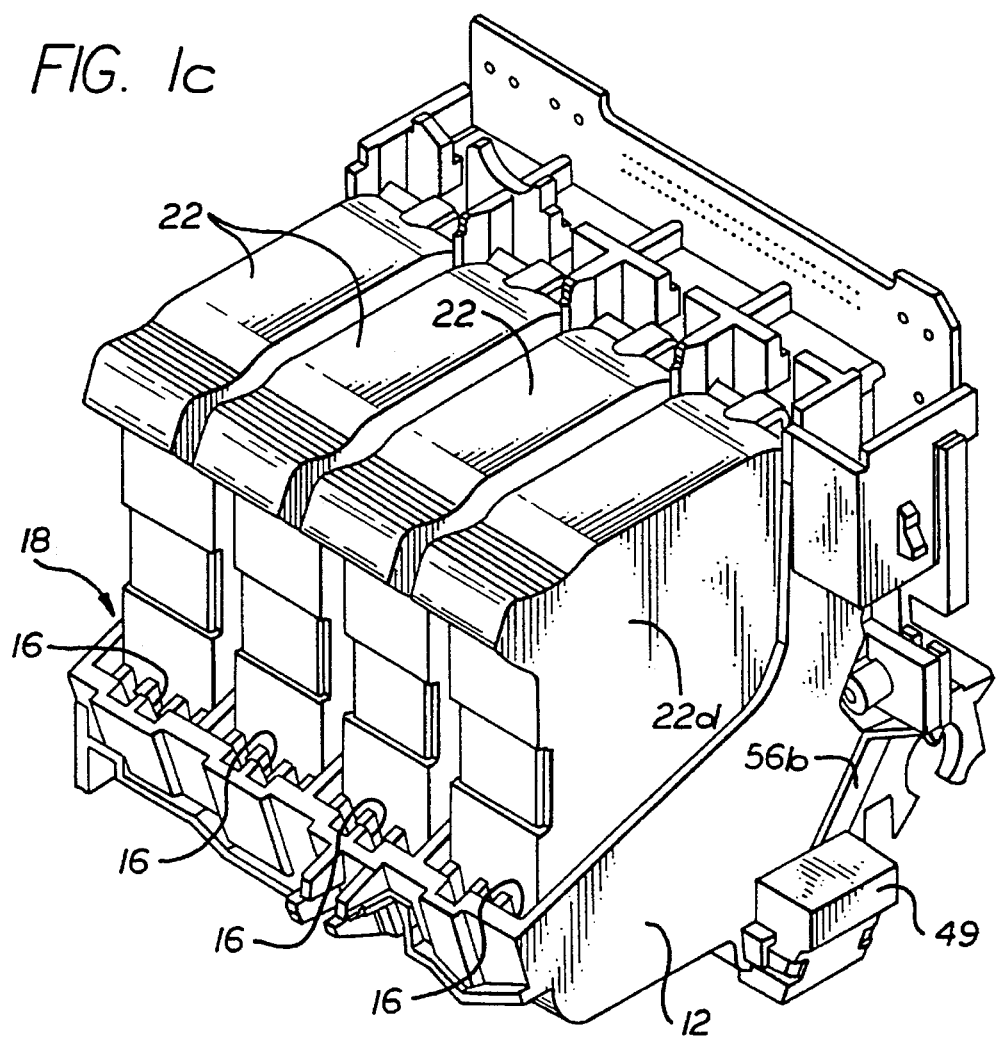
FIG. 1c is a perspective view of the carriage assembly which shows the assembly with the four inkjet pens installed in four pen stalls.

FIG. 1c shows the carriage assembly 18 with the four inkjet pens 22 installed in four pen stalls 16 in unitary housing 12.

Figure 2:
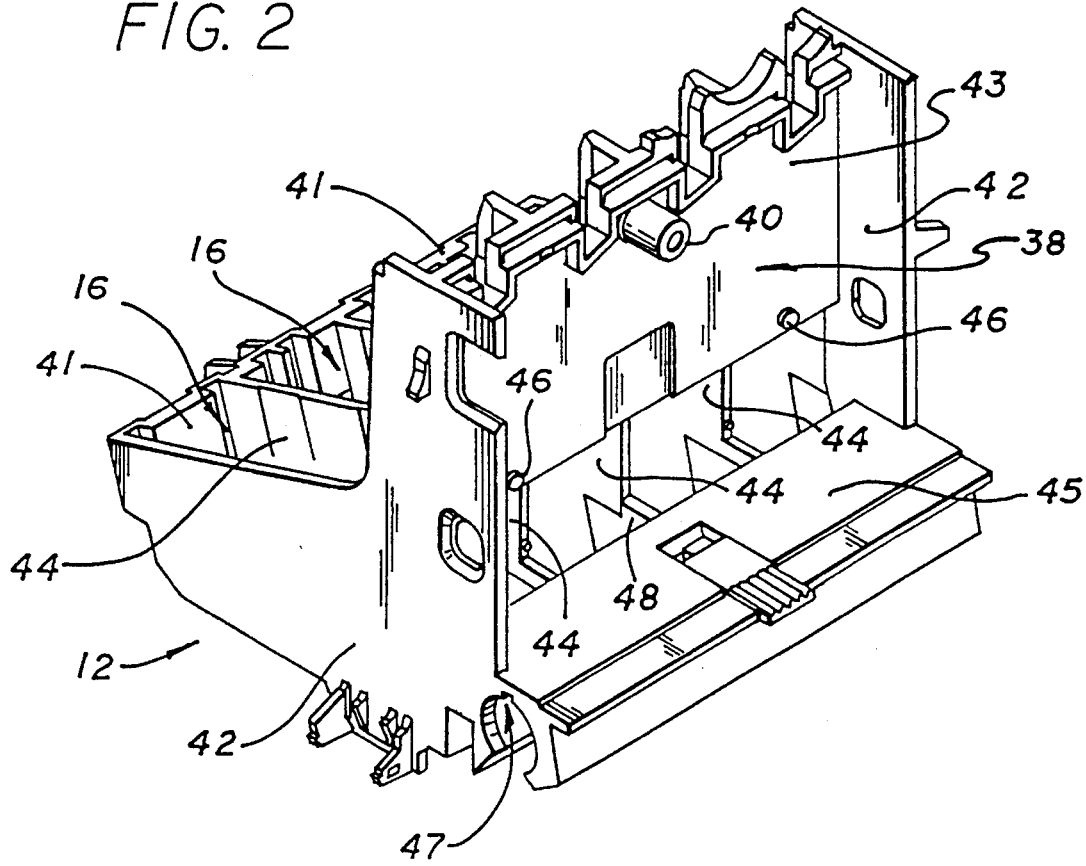
FIG. 2 is a rear perspective view of the unitary housing constructed in accordance with the teachings of the present invention without the pens and the circuit board.
Figure 7A:
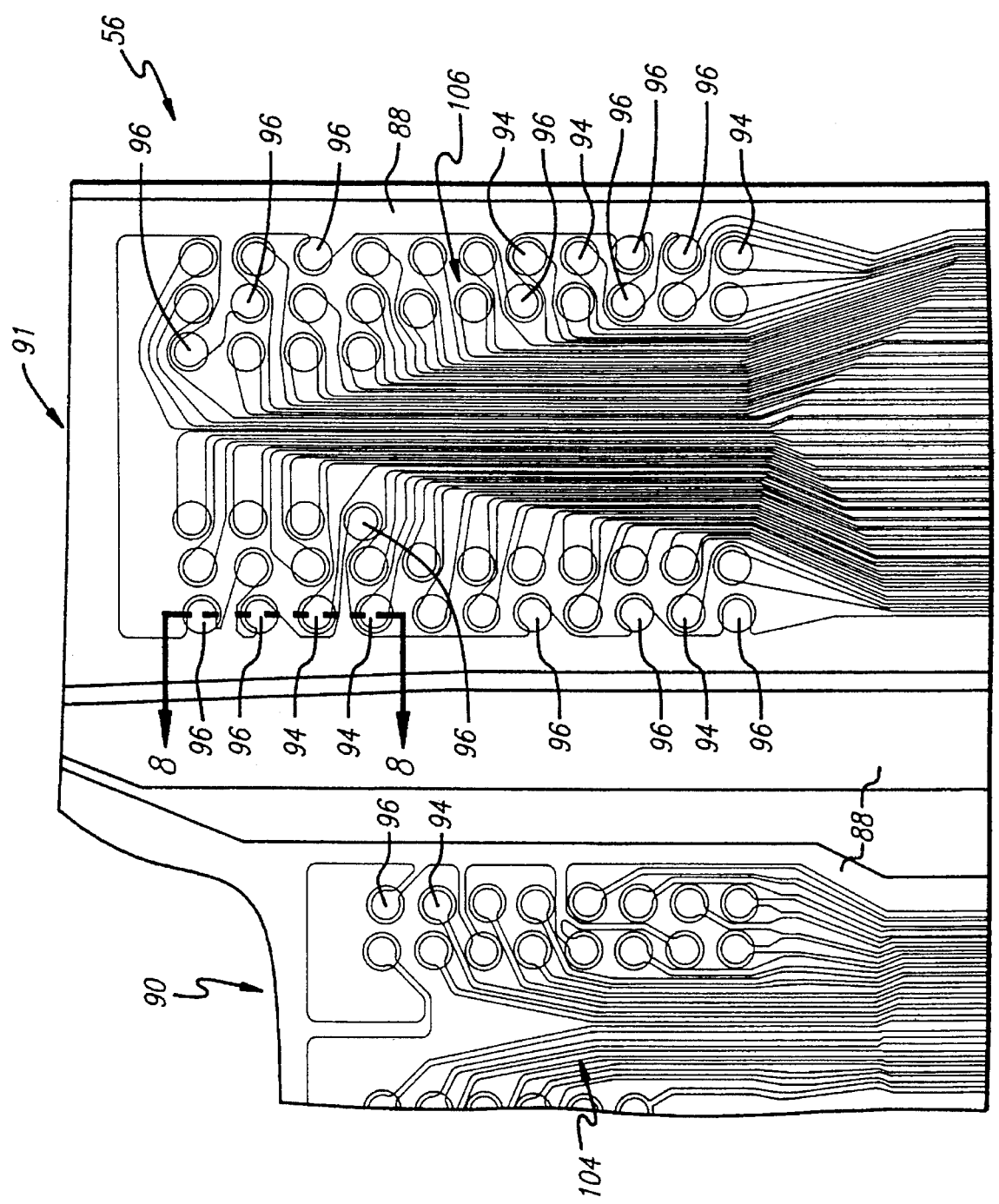
FIG. 7a is a magnified view of a portion of the first flexible circuit showing a dissimilar pattern of electrical contacts and associated conductive trace at the first end thereof in accordance with the present teachings.

FIG. 2 is a rear perspective view of the unitary housing 12 constructed in accordance with the teachings of the present invention without the pens and the circuit board. The unitary housing 12 is of one-piece construction. The housing 12 retains the inkjet pens in a fixed relation to each other on the printer carriage. The unitary housing 12 has a front wall 41, two lateral walls 42, three pen stall walls 44, and rear wall 43, which form four pen stalls 16. It also has a rear FIG. 7a is a magnified view of the first flex circuit 56a showing the dissimilar pattern of electrical contacts 91 and associated conductive trace at the first end of the substrate 88. Each identical individual set of electrical signal and ground contacts 90, 91 has plural signal contacts 94 and plural electrical ground contacts 96.

At the second end 75 of substrate 88, are four individual sets of electrical signal contacts 98. Three substantially identical electrical trace patterns 104 connect the contacts 94 and 96 with the contacts 98.

Figure 7B:
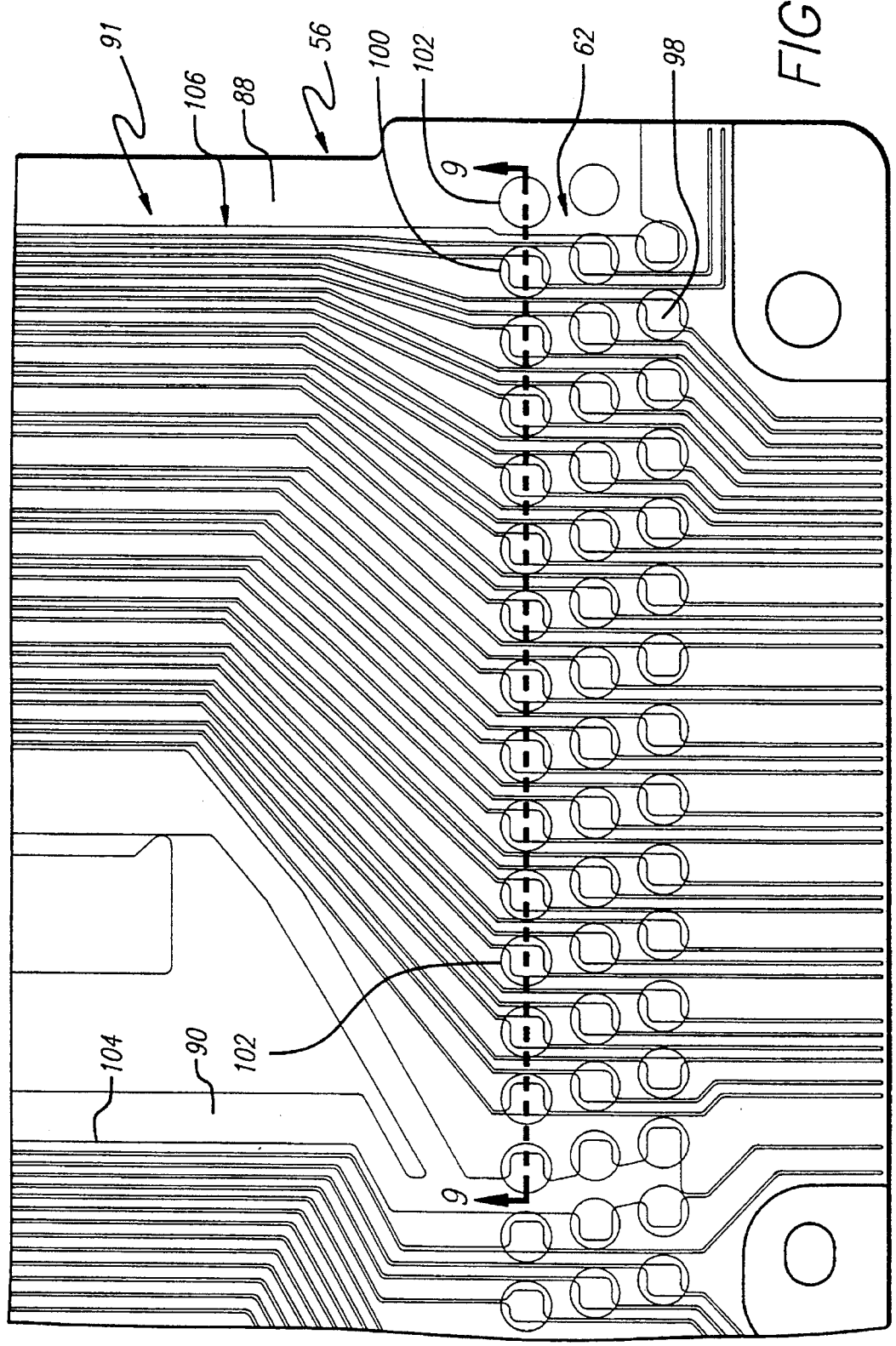
FIG. 7b is a magnified view of a portion of the first flexible circuit showing the dissimilar pattern of electrical contacts at the second end thereof.

FIG. 7b is a magnified view of the dissimilar pattern of electrical contacts at the second end of the flex circuit 56. As shown in FIG. 7b, the dissimilar trace pattern 106 connects the contacts 94 and 96 to the contacts 62 of the dissimilar pattern 91. In FIGS. 7a and 7b, each line represents the edge of the trace.

The three similar patterns 104 are identical with the exception of the lower portions thereof which may be shifted to line-up with associated contacts 98.

In accordance with the inventive method, the pattern of conductive material or trace 106 at the first end of the first flex circuit 56a is made in accordance with the following design rules. The conductive material is created around each of the contacts 91 while maintaining a minimum keep-out radius around each contact. This serves to maintain the flexibility of the circuit 56a. The width of each trace is trimmed in accordance with a design specification, e.g., so that the resistance of each trace is equal to the resistance of the other traces. The width of each trace is maximized near the associated contact while that from neighboring contacts is thinned. The taper is designed with the realization that the width of the trace determines the susceptibility of the trace to breakage as well as the fact that the more conductive material is deposited on the substrate, the more stiff the circuit becomes. Ideally, the contacts, which are raised as protrusions or dimples, should float independent from the neighboring dimples. Finally, the ground contacts are shorted together.

The length of the mid-section of each trace is determined in accordance with the wrap-around distance around the end of the unitary frame 52.

Figure 8:
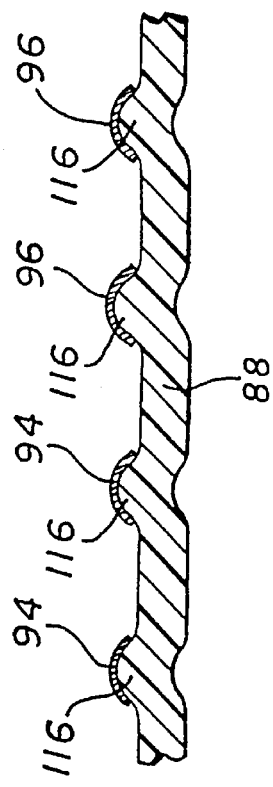
FIG. 8 is a sectional side view taken along section 8—8 of FIG. 7a showing protrusions on the substrate of the first flexible circuit.

FIG. 8 is an illustrative diagram of section 8—8 of FIG. 7a showing protrusions 116 on substrate 88 constructed in accordance with the present invention. As shown in FIG. 8, electrical signal contacts 94 and electrical ground contacts 96 are provided on protrusions 116.

Figure 9:
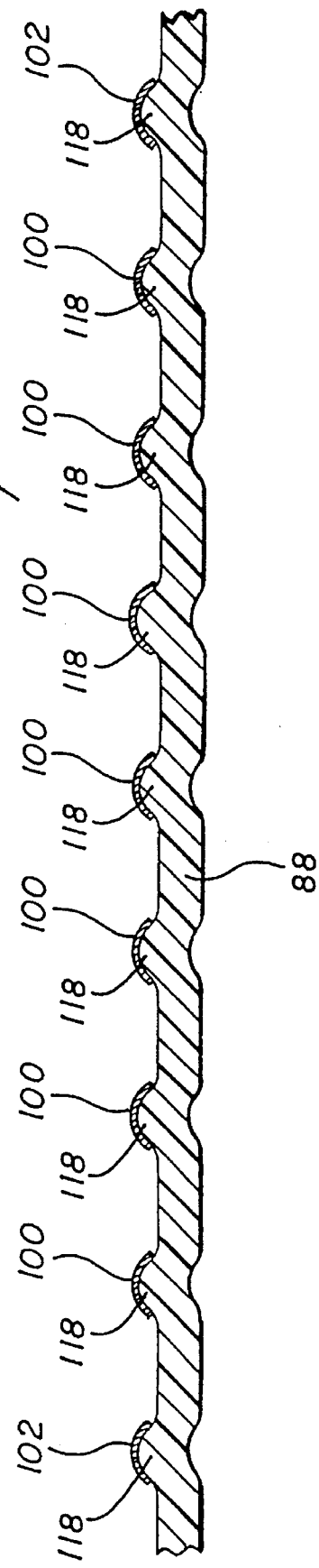
FIG. 9 is a sectional side view taken along section 9—9 of FIG. 7b showing protrusions on the substrate of the first flexible circuit.

Similarly, FIG. 9 is an illustrative diagram of a section 9—9 of FIG. 7b showing protrusions 118 on substrate 88. A similar contact arrangement is disposed on the second flex circuit. As shown in FIG. 9, contacts 62 include signal contacts 100 and ground contacts 102 on protrusions 118. The electrical contacts on protrusions 116 make contact with corresponding electrical contacts on the inkjet pens 22 and electrical contacts on protrusions 118 make contact with corresponding electrical contacts on circuit board 54.

Figure 10:
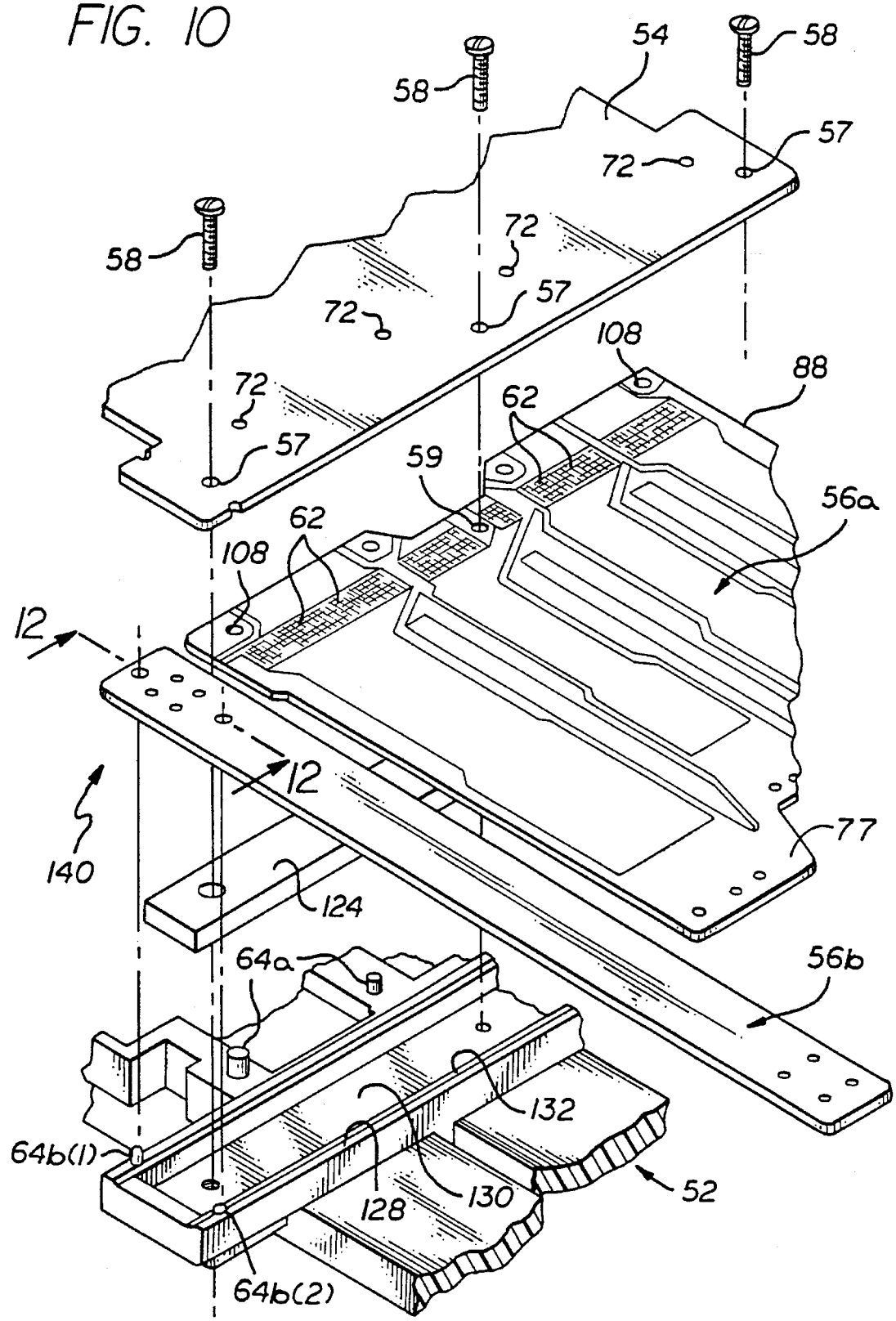
FIG. 10 is an assembly view showing the circuit board, the flexible circuits, elastomeric pad, and plastic support of the present invention.

In FIG. 10 the interconnect system 140 is shown in an assembly view. Electrical contacts 62 are located on protrusions 118 on substrate 88, as shown in FIG. 9. As shown in FIG. 10, the circuit board 54 and the flex circuits are assembled on a unitary frame 52. The frame 52 may be constructed of plastic or other suitable material. A low pressure is effective to interconnect the circuit board contacts 134 and electrical contacts 98. An elastomeric pad 124, which can be constructed of urethane rubber, provides a spring force and is mounted into recess 130 in unitary frame 52. The electrical interconnect system 140 is assembled with screws 58 that are inserted through circuit board attachment hole 57 on circuit board 54 and flex circuit holes 59 on flex circuit 56. The screws are then secured into attachment holes 126 on the unitary frame 52.

As mentioned above, the electrical contacts 62 on the first flex circuit 56a are aligned to circuit board contacts 134 on circuit board 54 by alignment pins 64 coupled to unitary frame 52. The alignment pins 64 are inserted through alignment holes 108 on the first flex circuit 56a and alignment holes 72 on circuit board 54. When the electrical interconnect system is assembled the electrical contacts 62 are aligned and make electrical contact with circuit board contacts 134. A minimum distance is provided between the beginning of the trace and the alignment holes. This allows for a flexing or bowing of the flex circuit in response to contact pressure to allow for contact of the electrical contacts thereof with corresponding electrical contacts on the circuit board 54. The provision of the extension 77 for the dissimilar pattern 91 allows for a different degree of flexure of the section of the flex circuit 56 on which the dissimilar pattern 91 is deposited.

Figure 11:
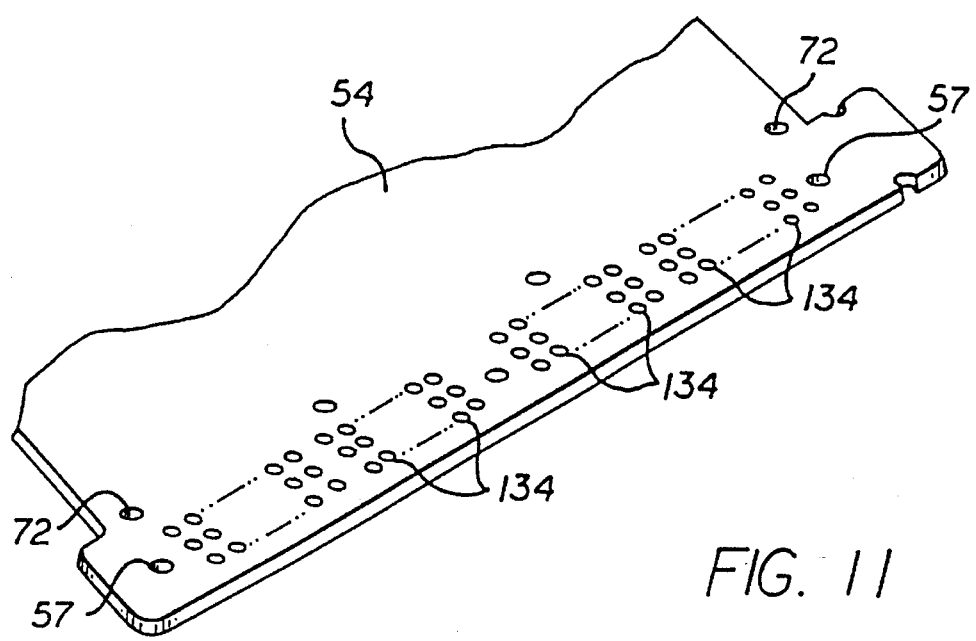
FIG. 11 is a partial perspective view of the circuit board showing contacts on one side thereof which interconnect with corresponding electrical contacts on the flexible circuit.

FIG. 11 shows the opposite side of circuit board 54 with circuit board contacts 134 which interconnect with corresponding electrical contacts 62 on the flex circuits. The arrangement of circuit board contacts 134 on circuit board 54 correspond to the arrangement of electrical contacts 62 on the flex circuits. Each of the circuit board contacts 134 are gold plated to insure a low resistance electrical path.

Figure 12:
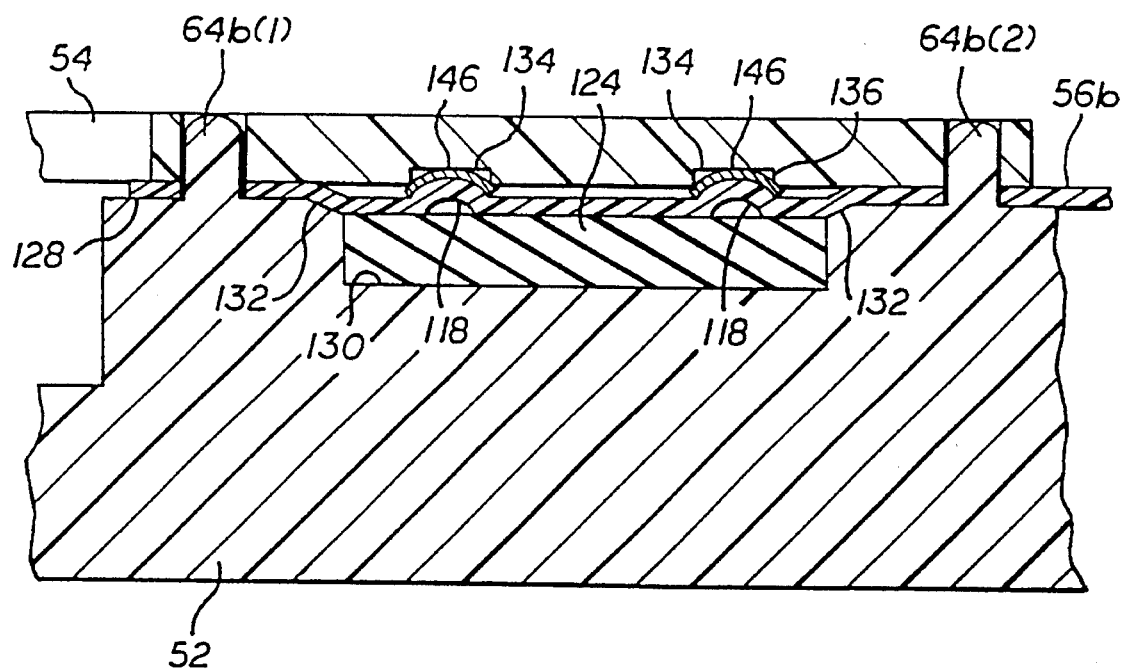
FIG. 12 is a sectional side view taken along line 12—12 of FIG. 10 showing the interconnect system of the present invention in assembled relation on the second flexible circuit.

FIG. 12 is an illustrative diagram of an elevation section along line 12—12 of FIG. 10 of an assembled improved electrical interconnect system for the flex circuit constructed in accordance with the present invention. In FIG. 12 the elastomeric pad 124 is shown to fit within recess 130 in the unitary frame 52. The elastomeric pad 124 provides a spring force that pushes upon the electrical contacts 100 on protrusions 118 between the elastomeric pad 124 and the circuit board 54. The unitary frame 52 has bevels 132 between the recess 130 and the top surface 128 of the unitary frame 52. As the screws 58 are tightened, a portion of the second flex circuit 56b is clamped between the top surface 128 of unitary frame 52 and the circuit board 54. Bevels 132 provide relief to the portion of flex circuit 56 between elastomeric pad 124 and circuit board 54.

Also shown in FIG. 12 are circuit contact recesses 136, which contain circuit board contacts 134. The circuit contact recesses 136 on circuit board 54 are the result of a coating such as a solder mask that is applied over the conductors on circuit board 54 to protect the conductors from corrosion and to prevent solder bridging. This allows for slight circuit contact recesses 136 on the order of 0.001–0.002 inches deep at each of the circuit board contacts 134, which as discussed above are gold plated. During assembly, the portion of flex circuits between elastomeric pad 124 and circuit board 54 deforms, which allows the protrusions 118 on flex circuits to align with the circuit contact recesses 136 on circuit board 54 to ensure proper electrical contact.

Thus, the present invention has been described herein with reference to a particular embodiment for a particular application. Nonetheless, those having ordinary skill in the art and access to present teachings will recognize additional modifications, applications, and embodiments within the scope thereof.

It is therefore intended by the appended claims to cover any and all such applications, modifications and embodiments within the scope of the present invention.

Accordingly, compartment 38 formed by lateral walls 42, rear wall 43, base 45, and the spaces between pen stall walls 44 closest to base 45. The four pen stalls 16 have passages that communicate to the rear stall between rear wall 43 and base 45 and between the pen stall walls 44. A first portion 47 integral to the unitary housing 12 extends along a first axis and is adapted to engage the carriage bar 15. The pen stalls 16 each extend along a second axis and are substantially transverse to and integral with the first portion 47. Rear compartment 38, extending along a third axis, is substantially transverse to and integral with the first and second portions and adapted to retain a substantially planar frame circuit assembly 14 within a plane defined by the first and third axes.

FIGS. 3a–3c illustrate how a removable frame circuit assembly 14 is installed into the rear compartment 38 in unitary housing 12. As illustrated in FIG. 3c, the removable frame circuit assembly 14 is fastened to unitary housing 12 with a single attachment device 20. The single attachment device 20, which can be a simple screw, mates with a single attachment point 40 (not shown) on unitary housing 12 to attach the removable frame circuit assembly 14 to the unitary housing 12.

Figure 4A:
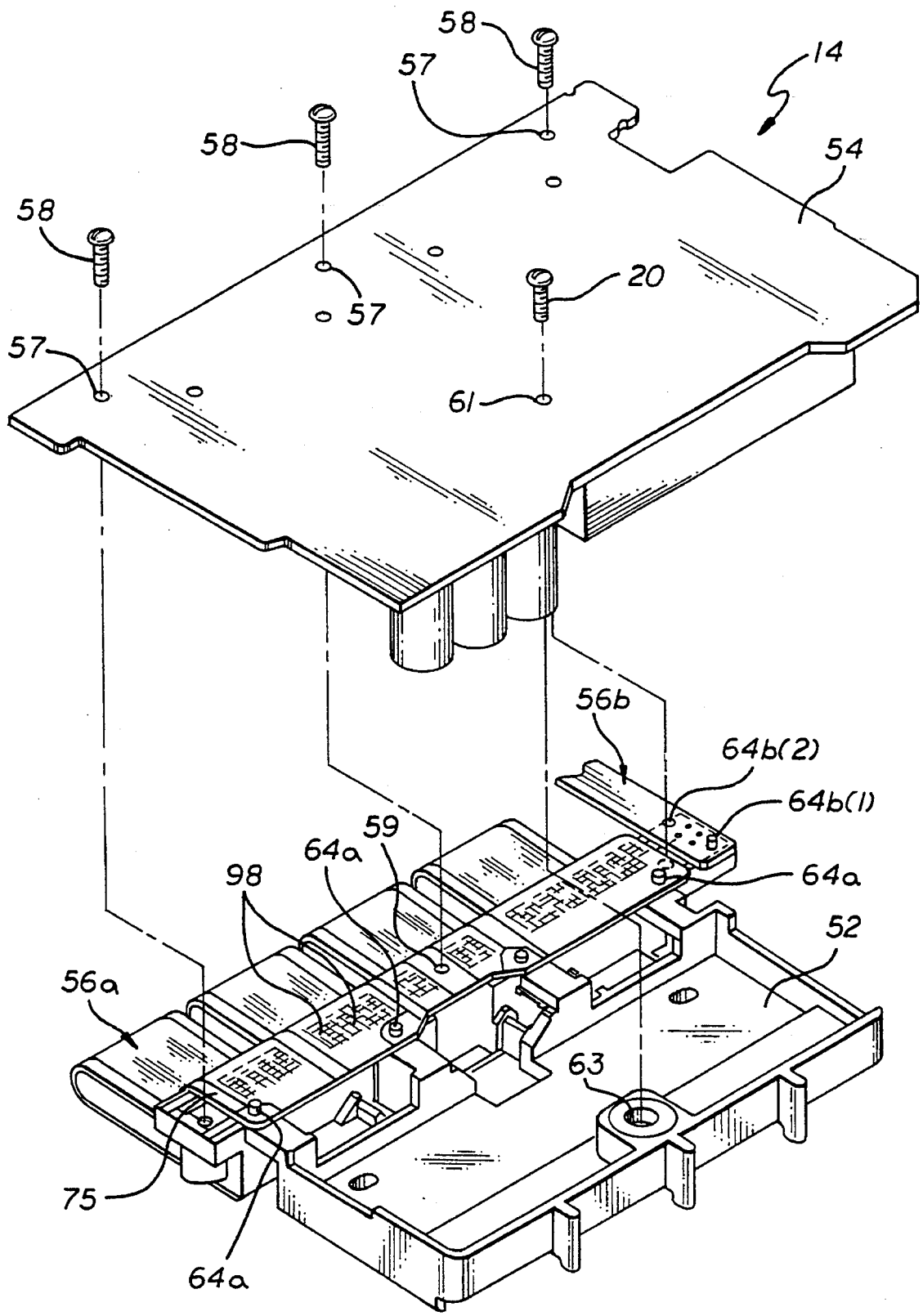
FIG. 4a is a perspective view which illustrates how the unitary frame assembles with a circuit board and the flexible circuits to form removable frame circuit assembly in accordance with the present teachings.
Figure 4B:
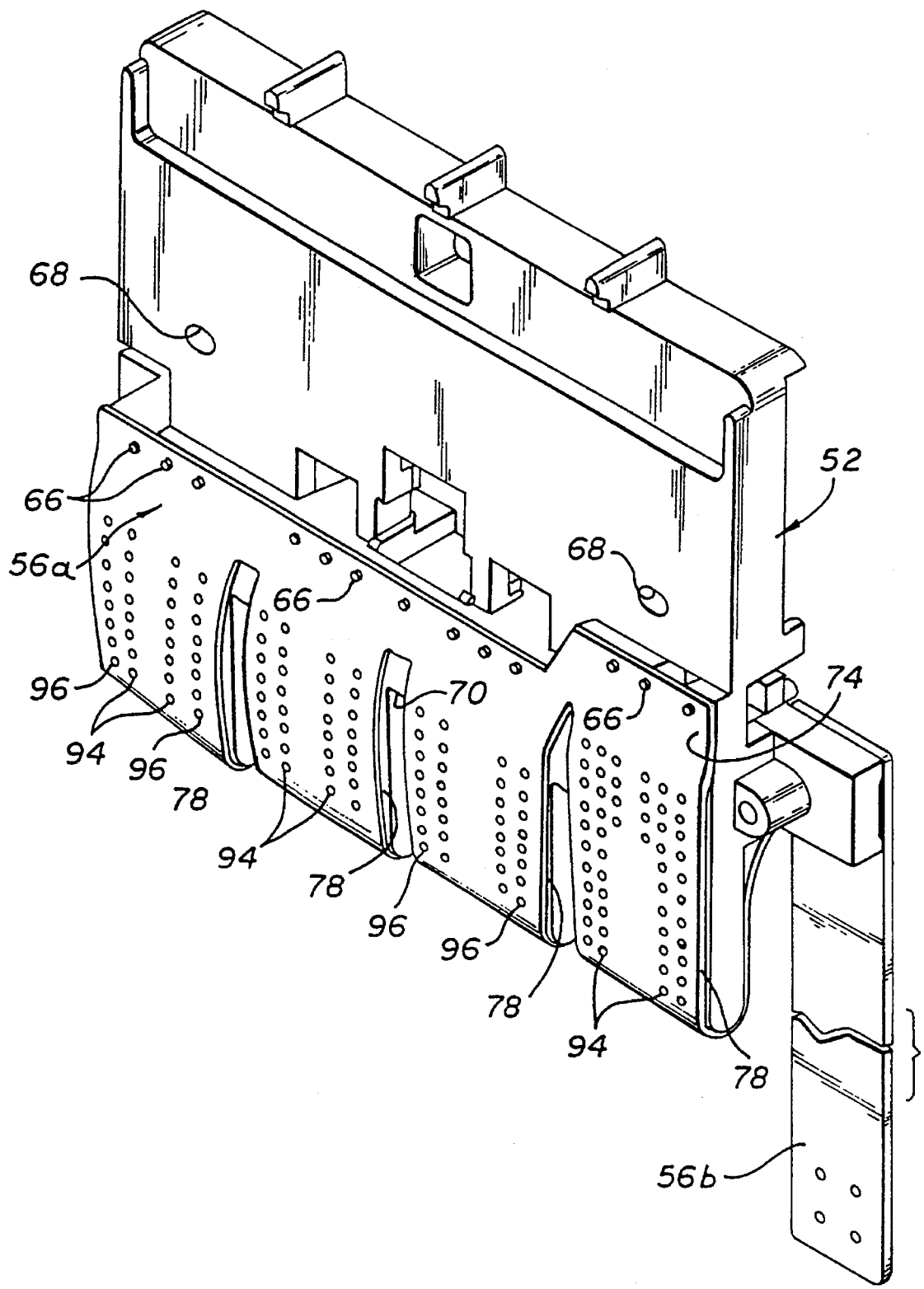
FIG. 4b is a front perspective view of the flexible circuits on the unitary frame.

FIG. 4a illustrates how a unitary frame 52 assembles with a circuit board 54, a first flexible circuit 56a, and a second flexible circuit 56b, in accordance with the present teachings, to form the removable frame circuit assembly 14. FIG. 4b is a front perspective view of the flexible circuits 56a and 56b on the unitary frame 52. The provision of multiple flexible circuits on a single frame is a particularly unique and advantageous feature of the present invention in that it allows for the connection of additional circuits and devices with minimal increases in the width of the carriage. As discussed more fully below, this is achieved by the use of a first set of pins 64a arranged along a first (x) axis to align the first flexible circuit 56a and a second set of pins 64b(1) and 64b(2) arranged along a second (y) axis, perpendicular to the first axis, to align the second flexible circuit 56b. In the illustrative embodiment, the second flexible circuit 56b is connected to a paper sensor 49 shown mounted on the side of the unitary housing 12 in FIG. 2. The alignment pins 64a mate with alignment holes 108 FIG. 6a and alignment pins 66 mate with alignment holes 110 FIG. 6a. The first flex circuit 56a is wrapped over extensions 78 that are on one end of unitary frame 52.

As shown in FIG. 4a, the circuit board 54 is attached to the unitary frame 52 with devices such as screws 58 that pass through circuit board attachment holes 57 and flexible circuit hole 59 and into unitary frame 52. The single attachment device 20 passes through circuit board attachment hole 61 and unitary frame hole 63, when attaching removable frame circuit assembly 14 to unitary housing 12.

The removable frame circuit assembly 14 should be properly aligned to the unitary housing 12, as electrical contacts (not shown) on the inkjet pens must engage electrical contacts on the removable frame circuit assembly 14 when the pens are mounted in pen stalls 16. The alignment of removable frame circuit assembly 14 to unitary housing 12 is provided by two vertical alignment pins 46 (shown in FIG. 2) for vertical alignment and by a single horizontal alignment wall 48 for horizontal alignment. The vertical alignment pins 46 mate with alignment holes 68 on removable frame circuit assembly 14, shown in FIG. 4b. The single horizontal alignment wall 48 is a vertical wall in unitary housing 12. Alignment slot 70 on removable frame circuit assembly 14, shown in FIG. 4b, slides over and aligns to single horizontal alignment wall 48 when the removable frame circuit assembly 14 is assembled with unitary housing 12.

As illustrated in FIGS. 2, 3a–c, and 4, when the circuit assembly 14 is installed into unitary housing 12, the extensions 78 slide into the passages between pen stall walls 44 and rear wall 43 and behind base 45. This positions electrical contacts 94, 96 on the first flex circuit 52a for interconnection with corresponding electrical contacts (not shown) on the inkjet pens 22.

Figure 5A:
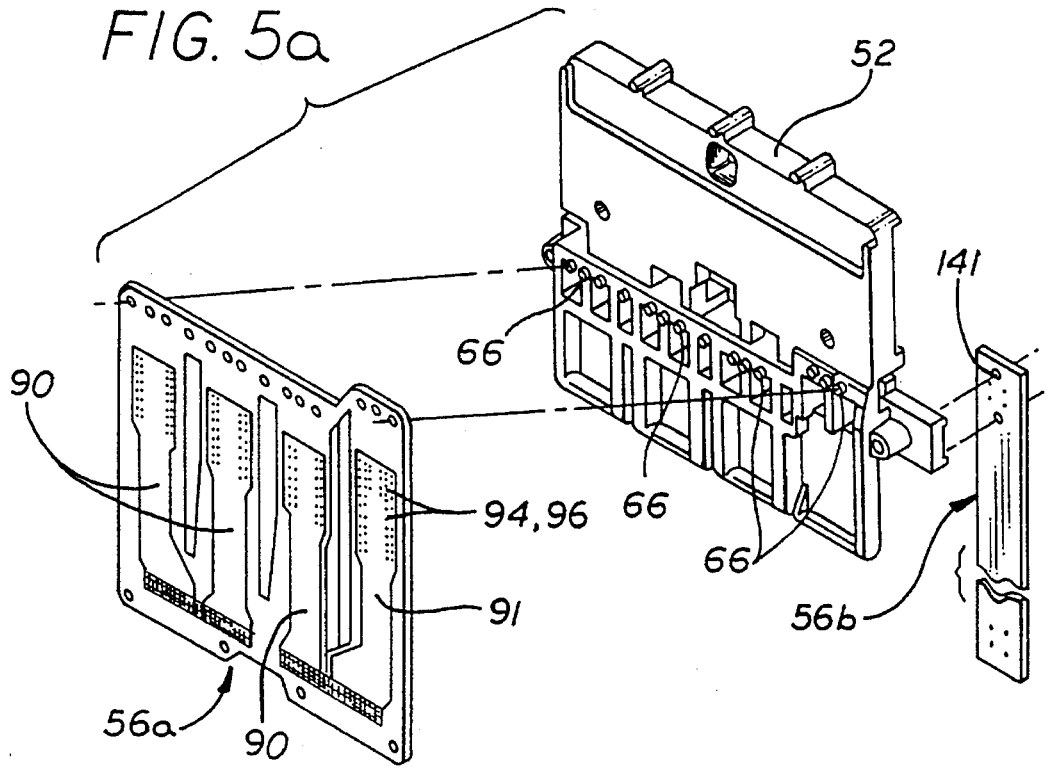
FIGS. 5a is a perspective front view illustrating how the flexible circuits assemble on the unitary frame.
Figure 5B:
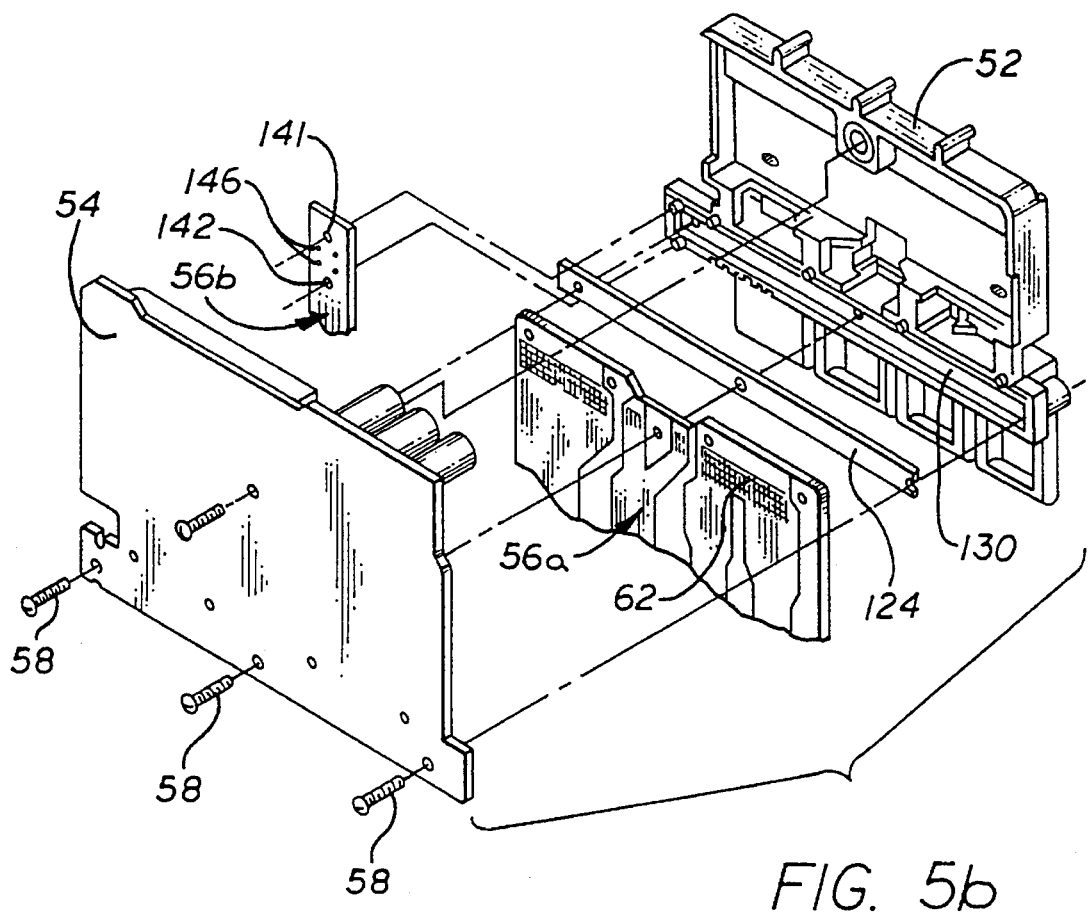
FIG. 5b is a perspective rear view which illustrates how the flexible circuits assemble with the unitary frame and the circuit board to form the removable frame circuit assembly.
Figure 5C:
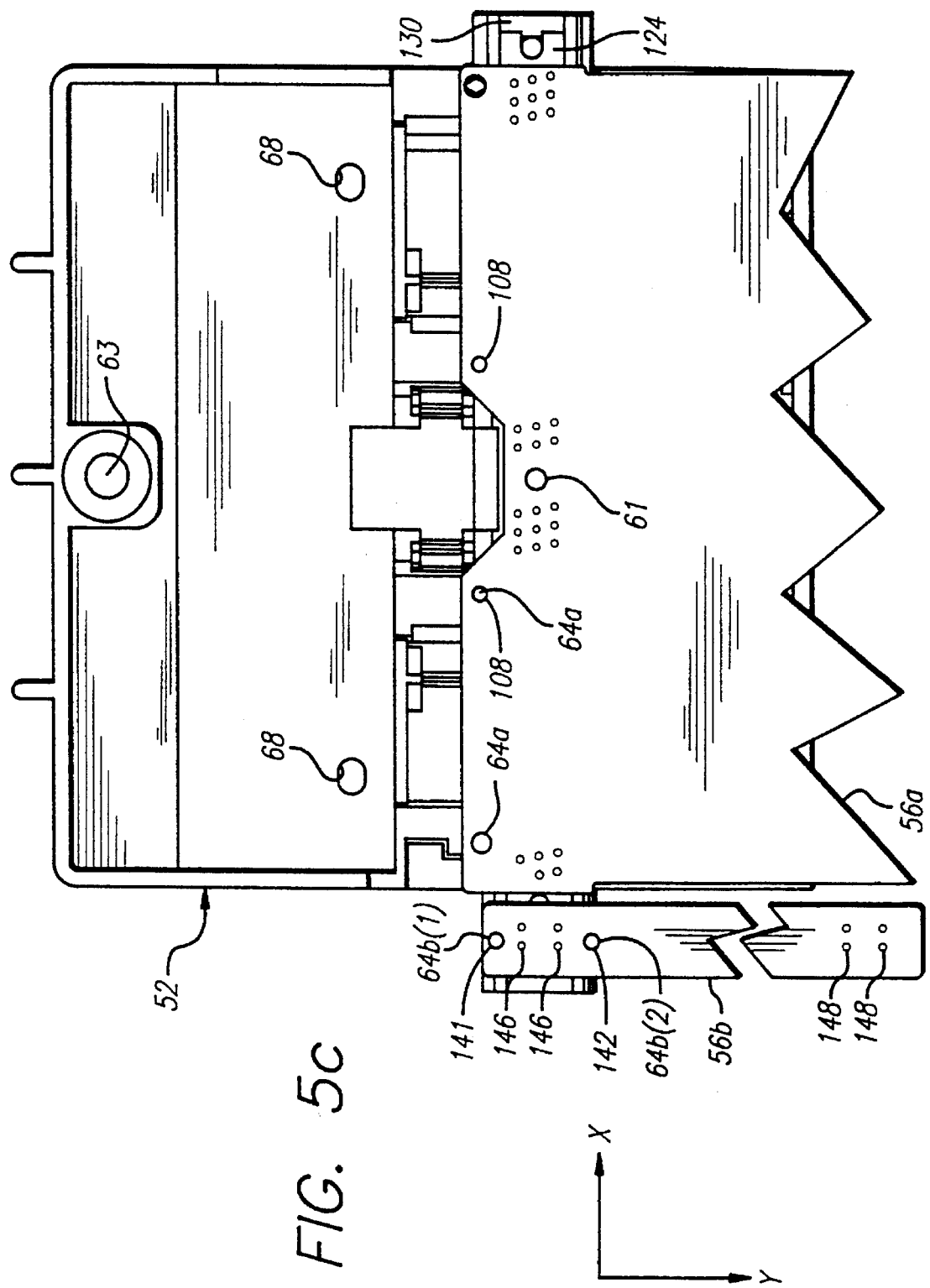
FIG. 5c is a rear view of the first and second flexible circuits assembled on the unitary frame.

FIGS. 5a and 5b show the assembly of the first flex circuit 56a and the second flex circuit 56b on the unitary frame 52. FIG. 5c is a frontal view of the first and second flex circuits assembled on the unitary frame 52. These components along with the circuit board 54 form the removable frame circuit assembly 14. As shown in FIG. 5a, the first flex circuit 56a is first aligned and attached to unitary frame 52 on pins 66. Then, as shown in FIG. 5b, an elastomeric pad 124 is placed into recess 130 in unitary frame 52. Next, the second flex circuit 56b is aligned and attached to the unitary frame 52 on pins 64b(1) and 64b(2). The first flex circuit 56a is then wrapped over one end of unitary frame 52 and electrical contacts 62 are aligned onto unitary frame 52 and over the elastomeric pad 124. The circuit board 54 is then attached to the unitary frame 52 to make contact with electrical contacts 62 on the first flex circuit 56a and to make contact with the electrical contacts 146 on the second flex circuit 56b.

FIG. 6a is a top plan view of the first flex circuit 56a and FIG. 6b is a top plan view of the second flex circuit 56b. The first flex circuit 56a includes a substrate 88, which has a first end 74 and a second end 75. The first flex circuit 56a is constructed with a polyester or polyamide material such as Mylar or Kapton substrate 88 onto which multiple conductors and contacts are created. The conductors and contacts are made of copper. In addition, the contacts are dimpled and plated with nickel and gold. In accordance with the present teachings, another layer of Mylar or Kapton is provided over each trace so that only the contacts are exposed. The first flex circuit 56a has two areas of electrical contacts: electrical contacts 94, 96 on the first end 74 and electrical contacts 62, 63 on the second end 75. The electrical contacts on the second end 62, 63 interconnect with the circuit board 54. The electrical contacts 94, 96 are for electrical interconnection with the inkjet pens 22 held in pen stalls 16. All of the contacts on the first flex circuit protrude from the plane of the circuit and are plated with nickel and gold. At the first end 74 of the substrate 88, are three identical individual sets of electrical signal and ground contacts 90 and one dissimilar set of contacts 91 for interconnection to the signal contacts on an inkjet pen. An extension 77 is provided on the first end 74 in accordance with the design rules of the inventive method discussed below to accommodate the fourth trace and contact pattern for a dissimilar type of pen. Alignment holes 108 are shown on the second end 75 and holes 110 are shown on the first end 74.

As illustrated in FIG. 6b, the second flex circuit 56b has first and second apertures 141 and 142 disposed vertically therethrough. The first and second apertures are designed to receive the alignment pins 64b(1) and 64b(2). The second flex circuit may be constructed with a polyester or polyamide material such as Mylar or Kapton substrate onto which multiple conductors and contacts are created. The conductors and contacts may be copper or other suitable material. In accordance with the present teachings, another layer of Mylar or Kapton is provided over each trace so that only the contacts are exposed. A first set of contacts 146 make electrical contact with mating contacts on the circuit board 54. These contacts are dimpled and plated with nickel and gold as well. A second set of pins 148 is disposed on the second end of the second flex circuit 56b for electrical connection with the paper sensor 49 or other device.

What is claimed is:

1. An improved interconnect system for an inkjet printer comprising:

a first unitary flexible circuit having a first contact means for providing a first electrical interconnection;

a second unitary flexible circuit having a second contact means for providing a second electrical interconnection;

third contact means for engaging said first contact means;

fourth contact means for engaging said second contact means;

fifth means for supporting said third contact means and said fourth contact means;

sixth means for aligning said first unitary flexible circuit relative to said fifth means whereby said first contact means is aligned relative to said third contact means;

seventh means for aligning said second unitary flexible circuit relative to said fifth means whereby said second contact means is aligned relative to said fourth contact means; and eighth means for retaining said first flexible circuit and said second flexible circuit in engagement with said fifth means for supporting said third contact means and said fourth contact means, wherein the eighth means includes an unitary rigid support means for supporting said first and second flexible circuits in a non-overlapping manner on said eighth means.

2. The invention of claim 1 wherein said first contact means includes plural first electrical contacts.

3. The invention of claim 2 wherein said each of said first electrical contacts is disposed on a protrusion in a substrate of said first flexible circuit.

4. The invention of claim 3 wherein said second contact means includes plural second electrical contacts.

5. The invention of claim 4 wherein each of said second electrical contacts is disposed on a protrusion in a substrate of said second flexible circuit.

6. The invention of claim 1 wherein said third contact means includes plural third electrical contacts.

7. The invention of claim 6 wherein said fourth contact means includes plural fourth electrical contacts.

8. The invention of claim 1 wherein said fifth means is a printed circuit board having a first axis.

9. The invention of claim 8 wherein said third and fourth electrical contacts are disposed along said first axis.

10. The invention of claim 9 wherein said sixth means for aligning said first unitary flexible circuit relative to said fifth means includes first and second pins disposed between said fifth means and said eighth means along said first axis.

11. The invention of claim 10 wherein said first flexible circuit further includes apertures therethrough to receive said first and second pins.

12. The invention of claim 10 wherein said seventh means for aligning said second unitary flexible circuit relative to said sixth means includes third and fourth pins disposed between said fifth means and said eighth means along a second axis.

13. The invention of claim 12 wherein said second axis is perpendicular to said first axis.

14. The invention of claim 12 wherein said second flexible circuit further includes apertures therethrough adapted to receive said third and fourth pins.

15. The invention of claim 1 wherein said eighth means further includes means for retaining said rigid support means relative to said fifth means.

16. The invention of claim 15 wherein said eighth means further includes spring means for providing a spring force for pressing the contacts of said first and said second flexible circuits to the contacts of said third and fourth contact means respectively.

17. The invention of claim 16 further including means for retaining said spring means.

18. The invention of claim 17 wherein said spring means includes an elastomeric pad.

19. The invention of claim 18 wherein said means for retaining said spring means includes a recess in said support means.

* * * * *